(12) United States Patent
Nishihara et al.

(10) Patent No.: US 9,100,601 B2
(45) Date of Patent: Aug. 4, 2015

(54) IMAGE PICKUP DEVICE AND CAMERA SYSTEM

(71) Applicant: Sony Corporation, Tokyo (JP)

(72) Inventors: Toshiyuki Nishihara, Kanagawa (JP); Hirofumi Sumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/346,885

(22) PCT Filed: Oct. 10, 2012

(86) PCT No.: PCT/JP2012/076180
§ 371 (c)(1),
(2) Date: Mar. 24, 2014

(87) PCT Pub. No.: WO2013/058147
PCT Pub. Date: Apr. 25, 2013

(65) Prior Publication Data
US 2014/0211058 A1    Jul. 31, 2014

(30) Foreign Application Priority Data

Oct. 18, 2011   (JP) .................................. 2011-228895

(51) Int. Cl.
*H04N 5/363* (2011.01)
*H04N 5/378* (2011.01)
(Continued)

(52) U.S. Cl.
CPC .......... *H04N 5/363* (2013.01); *H01L 27/14603* (2013.01); *H04N 5/378* (2013.01); *H04N 5/355* (2013.01); *H04N 5/3745* (2013.01); *H04N 2005/2255* (2013.01)

(58) Field of Classification Search
None
See application file for complete search history.

(56) References Cited

U.S. PATENT DOCUMENTS

| 4,710,817 A | 12/1987 | Ando |
| 6,690,420 B1 * | 2/2004 | Liu ............................... 348/241 |

(Continued)

FOREIGN PATENT DOCUMENTS

| JP | 61-152176 | 7/1986 |
| JP | 07-067043 | 3/1995 |

(Continued)

*Primary Examiner* — Albert Cutler
(74) *Attorney, Agent, or Firm* — Fishman Stewart Yamaguchi PLLC

(57) ABSTRACT

Provided are an image pickup device and a camera system that are capable of performing high-precision image pickup with less noise both at low illuminance and high illuminance without increasing the speed of a sense circuit and power consumption. The image pickup device includes a pixel array section including a plurality of pixels arranged in an array, each of the pixels including a photoelectric conversion device, a storage section, and an amplifier device configured to output an accumulated charge as an electrical signal, each of the pixels configured to output an electrical signal to an output signal line in response to photon incidence; and a sense circuit section including a sense circuit, the sense circuit configured to perform decision as to whether or not a photon is incident on the pixel in a predetermined period, in which the sense circuit includes an AD conversion device connected to the output signal line, the AD conversion device is allowed to operate by at least two modes, i.e., a one-bit output mode by binary decision and a gray-scale output mode by multi-bit resolution, and at least when the one-bit output mode is selected, the AD conversion device integrates output results from each of the pixels by a plurality of exposures to determine intensity of light incident on each of the pixels by calculation.

10 Claims, 14 Drawing Sheets

(51) Int. Cl.
*H01L 27/146* (2006.01)
*H04N 5/355* (2011.01)
*H04N 5/3745* (2011.01)
*H04N 5/225* (2006.01)

(56) References Cited

U.S. PATENT DOCUMENTS 8,615,132 B2 * 12/2013 Nikula et al. ............ 382/190
2007/0290914 A1 * 12/2007 Matsushita et al. ............ 341/155
2008/0278360 A1 * 11/2008 Koli ............................ 341/143
2009/0072120 A1 * 3/2009 McGarry et al. ............ 250/208.1
2010/0328504 A1 * 12/2010 Nikula et al. ................. 348/273
2011/0050969 A1 * 3/2011 Nishihara ..................... 348/296

FOREIGN PATENT DOCUMENTS

| | | |
|---|---|---|
| JP | 2011-071958 A | 4/2011 |
| JP | 2011-097581 A | 5/2011 |

* cited by examiner

RELATED ART

11(A)

11(B)

IMAGE PICKUP DEVICE AND CAMERA SYSTEM

TECHNICAL FIELD

The present disclosure relates to an image pickup device such as a CMOS image sensor and a camera system.

BACKGROUND ART

Recently, CMOS image sensors have been widely used in digital still cameras, camcorders, surveillance cameras, and the like, and the market for the CMOS image sensors has been expanded.

Each pixel in a CMOS image sensor converts incident light into electrons by a photodiode as a photoelectric conversion device, and accumulates the electrons for a certain period, and then outputs a signal corresponding to the amount of accumulated charge to an analog-digital (AD) converter contained in a chip. The AD converter digitalizes the signal, and then outputs the digitalized signal to a stage following the AD converter.

In the CMOS image sensor, for image pickup, such pixels are arranged in a matrix form.

FIG. 1 is a diagram illustrating a typical chip configuration of a CMOS image sensor that is a solid-state image pickup device.

This CMOS image sensor 10 includes a pixel array section 11, a row drive circuit 12, AD converters 13, switches 14, an output circuit 15, row control lines 16, vertical signal lines 17, and a transfer line 18.

In the pixel array section 11, a plurality of pixels PX are arranged along a row direction and a column direction in a matrix form, and the vertical signal line 17 is shared by a plurality of pixels PX arranged along the column direction, and is connected to the AD converter 13 arranged corresponding to each column.

On the other hand, the row drive circuit 12 selects only one row from a plurality of rows, and drives the row control line 16 to read the accumulated charges from the pixels PX in the selected row.

The row control line 16 is configured of one or a plurality of control lines to execute such reading from the pixels or resetting of the pixels.

As used herein, the term "resetting" refers to an operation in which the accumulated charges are discharged from the pixels to return the pixels to a state before exposure, and, for example, the resetting may be executed as a shutter operation immediately after reading from each row or when exposure starts.

At the time of reading, analog signals transmitted to the AD converter 13 through the vertical signal line 17 are converted into digital signals, and the digital signals are sequentially transmitted to the output circuit 15 through the switch 14 to be output to an image processing unit located inside or outside the chip that is not illustrated.

When the CMOS image sensor 10 completes reading from one row in such a manner, a next row is selected, and reading, AD conversion, and outputting are repeated in a similar manner. When processing on all of the rows is completed, outputting of one frame of image data is completed.

On the other hand, Japanese Unexamined Patent Application Publication No. H7-67043 (PTL 1) has proposed a novel technique of counting photons in a time-divisional manner.

In the counting technique, binary decision as to whether or not a photon is incident on a photodiode in a certain period is repeatedly performed a plurality of times, and results of the binary decisions are integrated to obtain two-dimensional image pickup data.

In other words, a signal from the photodiode in each certain period (each unit exposure period) is sensed, and when one or more photons are incident on the photodiode in the period, a counter connected to each pixel counts up by 1 irrespective of the number of incident photons.

If the frequency of photon incidence is random along a time axis, the actual number of incident photons and the number of counts follow the Poisson distribution; therefore, when the frequency of incidence is low, the actual number of incident photons and the number of counts have a substantially linear relationship, and when the frequency of incidence is high, an output is compressed.

Moreover, Japanese Unexamined Patent Application Publication No. 2011-71958 (PTL 2) has proposed a technique of improving an aperture ratio of pixels by separating a sense circuit and a counter circuit for the above-described time-divisional photon counting from the pixels and hierarchically arranging them.

Further, Japanese Unexamined Patent Application Publication No. 2011-97581 (PTL 3) has proposed an image pickup device that increases a dynamic range by using surface division by a plurality of pixels in combination with time-divisional photon counting.

Such a device may be used as a photon counting device in which an entire pixel array in a chip serves as one light reception surface.

An image sensor using such time-divisional or surface-divisional photon counting consistently treats data output from the pixels as digital data; therefore, random noise and fixed noise associated with transmission and amplification of analog signals are not generated.

At this time, only light shot noise and a dark current generated in the pixels remain, and a remarkably high S/N ratio is allowed to be obtained specifically in image pickup at low illuminance.

Such a device is expected to substitute one chip for a photomultiplier that needs an expensive and large-scale system and a photon counter configured of APDs together with a pulse counting unit at low cost, and to have a breakthrough impact on detection of ultra-low light in medical and biotechnology fields.

CITATION LIST

Patent Literature

[PTL 1] Japanese Unexamined Patent Application Publication No. H7-67043
[PTL 2] Japanese Unexamined Patent Application Publication No. 2011-71958
[PTL 3] Japanese Unexamined Patent Application Publication No. 2011-97581

SUMMARY OF THE INVENTION

In image pickup using time-divisional photon counting, the number of actually detectable photons is defined by the total number of reading decisions in one frame period forming one image.

For example, in a case where a 10-bit output is obtained by 1023 decisions as to whether or not a photon is incident, since a count probability never exceeds 1, the number of actually detectable photons is equal to or less than 1023.

FIG. 2 illustrates an example of the average number of incident photons in a unit exposure period and count probability (the average number of counts per unit exposure period).

It is assumed from randomness of photon incidence that a relationship therebetween typically follows the Poisson distribution.

In image pickup at low illuminance, for example, when the total number of photons incident on the pixel in one frame period is about 50, the average number of incident photon in FIG. 2 is equal to $50/1023 \approx 0.05$, and the count probability has a substantially equal value.

In other words, most of incident photons are actually counted without difficulty. Therefore, while an output substantially reflects the accurate number of photons, time-divisional photon counting is dominant, because analog transmission noise is not present.

On the other hand, in image pickup at high illuminance in which 4000 photons are incident in one frame period, for example, in an analog sensor in which a photodiode has an accumulated charge of 10000 electrons, such a number of electrons is allowed to be linearly counted at a maximum, and high-precision image pickup is possible.

On the contrary, in the above-described time-divisional photon counting, the upper limit of the number of counts in the above-described reading over 1023 times is 1023 electrons, and incidence of a plurality of photons in one exposure is counted by "1"; therefore, a large number of counting misses occurs.

Since an output is largely compressed accordingly, even though correction is performed, a large error remains.

Therefore, in a full digital image sensor using time-dimensional photo counting, to improve image pickup precision in image pickup at high illuminance, it is necessary to increase the total number of counts.

However, to do so, it is necessary to solve various issues including an increase in speed of a reading sense circuit and a reduction in power consumption.

Therefore, it is desirable to provide an image pickup device and a camera system that are capable of performing high-precision image pickup with less noise both at low illuminance and high illuminance without increasing the speed of the sense circuit and power consumption.

A solid-state image pickup device according to an embodiment of the present disclosure includes: a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence; and a sense circuit section including a sense circuit, the sense circuit configured to perform a process of detecting a pixel signal from the pixel, in which the sense circuit includes an analog-digital (AD) conversion device connected to the output signal line, the AD conversion device is allowed to operate by at least two modes, i.e., a one-bit output mode by binary decision and a gray-scale output mode by multi-bit resolution, and at least when the one-bit output mode is selected, the AD conversion device integrates output results from each of the pixels by a plurality of exposures to determine intensity of light incident on each of the pixels by calculation, or integrates output results from a plurality of pixels that are considered as a single light reception surface to determine intensity of light incident on the light reception surface by calculation.

A camera system according to an embodiment of the present disclosure provided with an image pickup device, an optical system, and a signal processing circuit, the optical system configured to form an image of a subject on the image pickup device, the signal processing circuit configured to process an output image signal of the image pickup device, the image pickup device including: a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence; and a sense circuit section including a sense circuit, the sense circuit configured to perform a process of detecting a pixel signal from the pixel, in which the sense circuit includes an analog-digital (AD) conversion device connected to the output signal line, the AD conversion device is allowed to operate by at least two modes, i.e., a one-bit output mode by binary decision and a gray-scale output mode by multi-bit resolution, and at least when the one-bit output mode is selected, the AD conversion device integrates output results from each of the pixels by a plurality of exposures to determine intensity of light incident on each of the pixels by calculation, or integrates output results from a plurality of pixels that are considered as a single light reception surface to determine intensity of light incident on the light reception surface by calculation.

According to the embodiments of the present disclosure, high-precision image pickup with less noise is allowed to be performed both at low illuminance and high illuminance without increasing the speed of the sense circuit and power consumption.

BRIEF DESCRIPTION OF DIAGRAMS

MODE(S) FOR CARRYING OUT THE INVENTION

Some embodiments of the present disclosure will be described below referring to the accompanying drawings.

Figure 3:
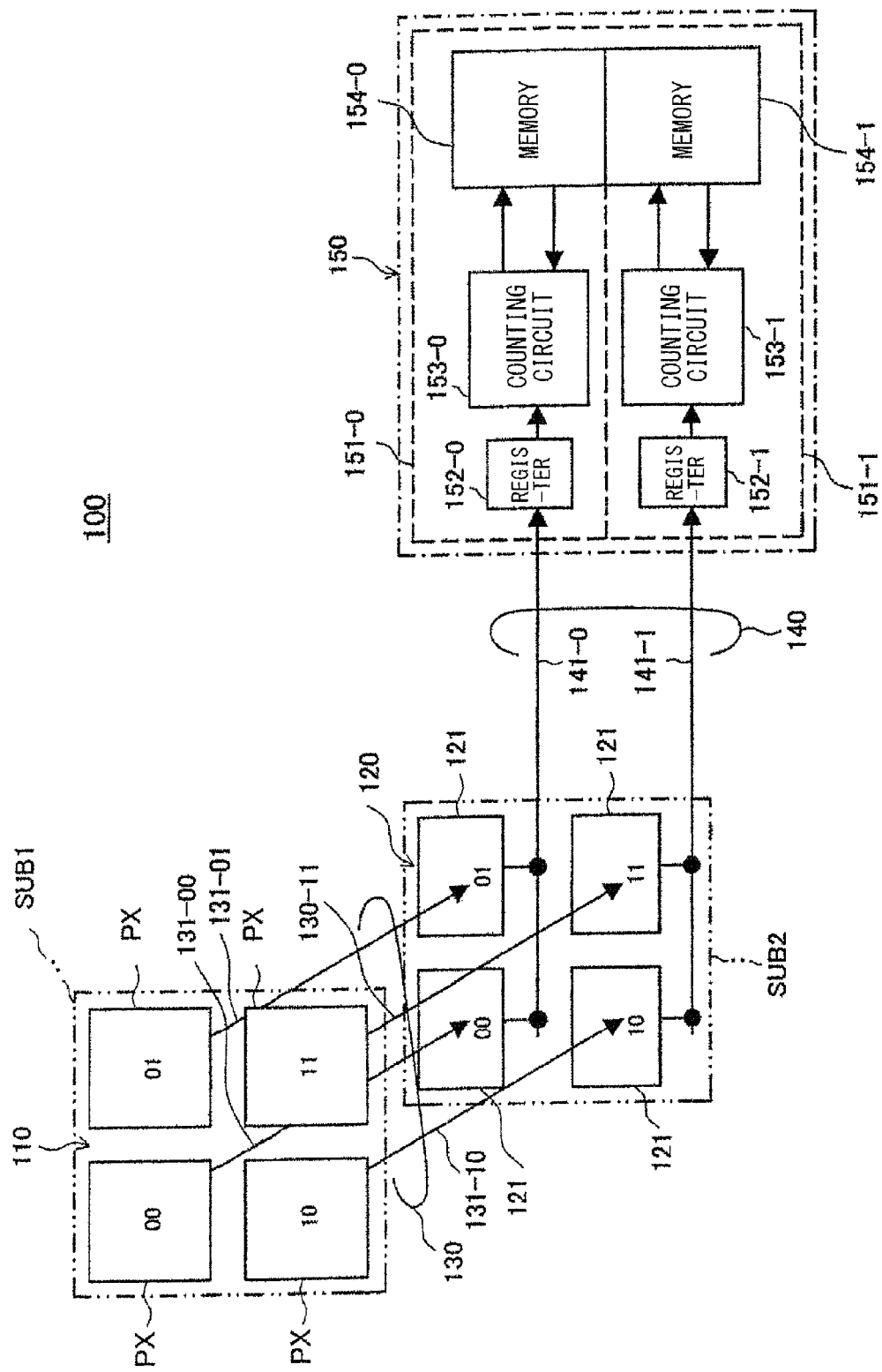
FIG. 3 is a diagram illustrating a configuration example of a CMOS image sensor (image pickup device) according to a first embodiment.

It is to be noted that description will be given in the following order.
1. First Embodiment (First configuration example of image pickup device)
2. Second Embodiment (Second configuration example of image pickup device)
3. Configuration example of camera system
4. Application Example to endoscope
5. Application Example to radiation detector 1. First Embodiment FIG. 3 is a diagram illustrating a configuration example of a CMOS image sensor (image pickup device) according to a first embodiment.

A CMOS image sensor 100 according to this embodiment has two modes, i.e., time-divisional photon counting and existing analog counting for a decision on sensing of an output of a same pixel.

The CMOS image sensor 100 is capable of performing a decision at a favorable S/N both at low illuminance and high illuminance.

[Summary of Entire Configuration]

This CMOS image sensor 100 includes a pixel array section 110, a sense circuit section 120, an output signal line group 130, a transfer line group 140, and a decision result integrated circuit section 150.

The pixel array section 110 includes a plurality of digital pixels PX arranged along a row direction and a column direction in a matrix form.

Each of the digital pixels PX includes a photoelectric conversion device, and has a function of outputting an electrical signal in response to photon incidence.

The pixel array section 110 is formed on, for example, a first semiconductor substrate SUB1.

The sense circuit section 120 is formed on a second semiconductor substrate SUB2 that is different from the first semiconductor substrate SUB1.

In the sense circuit section 120, a plurality of sense circuits are arranged, for example, along the row direction and the column direction in a matrix form so as to correspond to the plurality of pixels PX arranged in the matrix form of the pixel array section 110 on a one-to-one basis.

Each of the sense circuits 121 has a function of performing binary decision as to whether or not a photon is incident on the digital pixel PX in a predetermined period upon reception of a signal from the digital pixel PX.

The first semiconductor substrate SUB1 and the second semiconductor substrate SUB2 are laminated.

For example, the first semiconductor substrate SUB1 and the second semiconductor substrate SUB2 are laminated so as to allow the plurality of pixels PX formed on the first semiconductor substrate SUB1 and the plurality of sense circuits 121 formed on the second semiconductor substrate SUB2 to face each other on a one-to-one basis. The pixels PX and the sense circuits 121 facing each other are connected to each other through respective output signal lines 131 of the output signal line group 130.

In an example in FIG. 3, an output of a pixel PX-00 located in a 0th row and a 0th column is connected to an input of a sense circuit 121-00 located in a 0th row and a 0th column through an output signal line 131-00. An output of a pixel PX-01 located in the 0th row and a first column is connected to an input of a sense circuit 121-01 located in the 0th row and a first column through an output signal line 131-01.

An output of a pixel PX-10 located in a first row and the 0th column is connected to an input of a sense circuit 121-10 located in a first row and the 0th column through an output signal line 131-10. An output of a pixel PX-11 located in the first row and the first column is connected to an input of a sense circuit 121-11 located in the first row and the first column through an output signal line 131-01.

Although not illustrated, the pixels and the sense circuits located in other rows and columns are connected to each other in a similar manner.

In the sense circuit section 120, outputs of the sense circuits 121 located in a same row are connected to a common transfer line 141.

In the example in FIG. 3, outputs of the sense circuits 121-00, 121-01, . . . arranged in the 0th row are connected to a transfer line 141-0.

Outputs of the sense circuits 121-10, 121-01, . . . located in the first row are connected to a transfer line 141-1. Although not illustrated, the sense circuits in second and later rows are formed in a similar manner.

In this embodiment, as will be described in detail later, each of the sense circuits 121 of the sense circuit section 120 includes an AD conversion device including a comparator.

The AD conversion device is controlled to operate by at least two modes, i.e., a one-bit output mode by binary decision and a gray-scale output mode by multi-bit resolution.

Then, in the CMOS image sensor 100 according to this embodiment, at least when the one-bit output mode is selected, output results from each pixel by a plurality of exposures are integrated to determine intensity of light incident on each pixel by calculation.

In the CMOS image sensor 100, when the gray-scale output mode by multi-bit resolution is selected, output results by a smaller number (one or more) of exposures than the number of exposures in the one-bit output mode are integrated to determine intensity of incident light by calculation.

In the CMOS image sensor 100, the one-bit output mode is selected in image pickup at low illuminance, and the output mode by multi-bit resolution is selected in image pickup at high illuminance.

In the CMOS image sensor 100, when the one-bit output mode is selected, a pixel output is further subjected to signal amplification with a gain $G>1$, and then is input to the AD conversion device, and when the output mode by multi-bit resolution is selected, this signal amplification is not performed.

The decision result integrated circuit section 150 has a function of integrating decision results from each pixel by the sense circuit 121 a plurality of times to generate two-dimensional image pickup data with a gray scale.

In the decision result integrated circuit section 150, decision result integrated circuits 151-0, 151-1, . . . are arranged corresponding to row arrangement of the sense circuits 121 in the sense circuit section 120.

In other words, the decision result integrated circuit 151-0 is connected to a transfer line 141-0 to which the sense circuits 121-00, 121-01, . . . located in the 0th row is connected.

The decision result integrated circuit 151-1 is connected to a transfer line 141-1 to which the sense circuits 121-10, 121-11, . . . located in the first row is connected.

The decision result integrated circuit 151-0 includes a register 152-0 configured to hold a decision value transferred through the transfer line 141-0, a counting circuit 153-0 configured to count the value held by the register 152-0, and a memory 154-0 configured to hold a counting result by the counting circuit 153-0.

The decision result integrated circuit 151-1 includes a register 152-1 configured to hold a decision value transferred through the transfer line 141-1, a counting circuit 153-1 configured to count the value held by the register 152-1, and a memory 154-1 configured to hold a counting result by the counting circuit 153-1.

In this embodiment, the counting circuit 153-0 of the decision result integrated circuit 151-0 is shared by the plurality of sense circuits 121-00, 121-01, . . . .

The counting circuit 153-1 of the decision result integrated circuit 151-1 is shared by the plurality of sense circuits 121-10, 121-11, . . . .

[Configuration Example of Pixel]

As described above, each of the pixels PX includes the photoelectric conversion device and an amplifier device, and outputs an electrical signal in response to photon incidence.

The CMOS image sensor 100 as an image pickup device has a function of resetting the pixels PX and a function of reading from the pixels PX, and is allowed to execute resetting and reading at an arbitrary timing. In the resetting, the pixels PX are reset to a state in which a photon is not incident thereon. Each of the pixels PX may preferably include a lens and a color filter on a light reception surface thereof.

An example of the configuration of the pixel will be described below.

Figure 4:
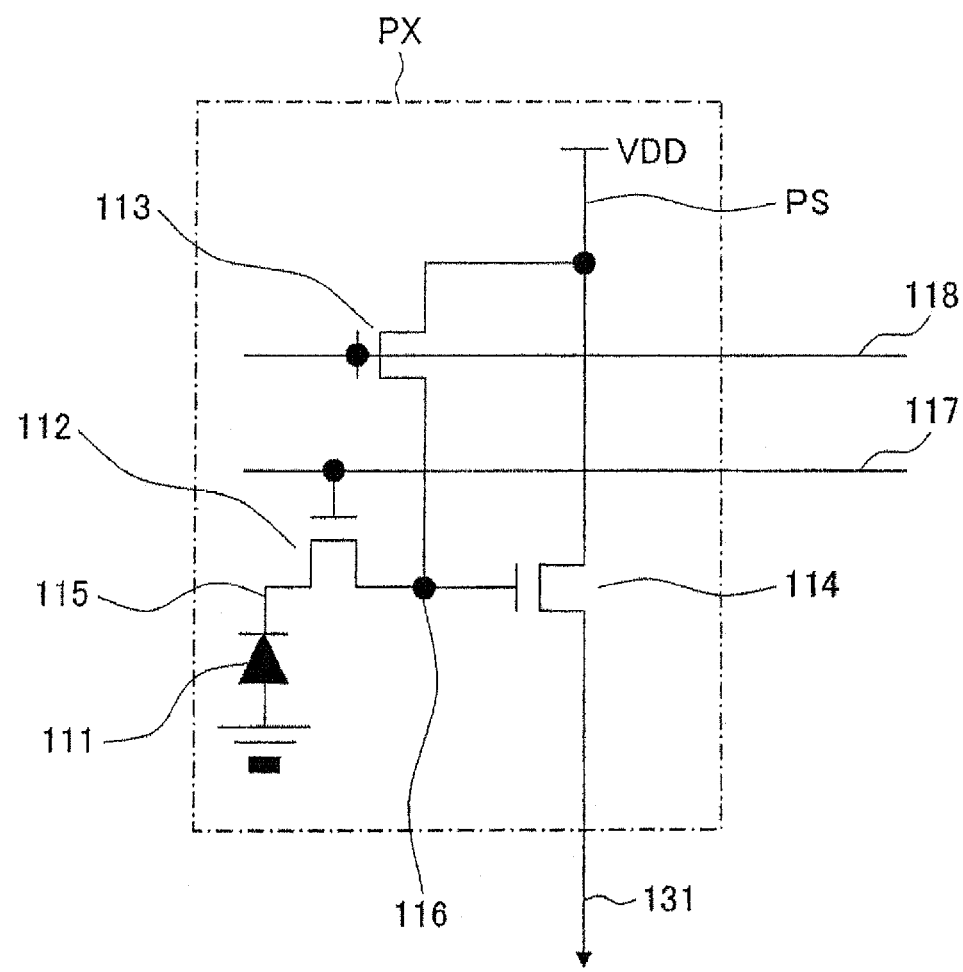
FIG. 4 is a diagram illustrating an example of a circuit configuration of a pixel according to the first embodiment.

FIG. 4 is a diagram illustrating an example of a circuit configuration of the pixel according to this embodiment.

FIG. 4 illustrates an example of a pixel circuit in which one unit pixel PX includes three transistors.

One unit pixel PX includes a photodiode 111 as a photoelectric conversion device, a transfer transistor 112, a reset transistor 113, and an amplifier transistor 114 as an amplifier device.

The pixel PX includes a storage node 115 and a floating diffusion (FD) node 116.

A gate electrode of the transfer transistor 112 is connected to a transfer line 117, and a gate electrode of the reset transistor 3 is connected to a reset line 118.

A gate electrode of the amplifier transistor 114 is connected to the FD node 116, and a source of the amplifier transistor 114 is connected to an output signal line 131. The FD node 116 functions as an input node of the amplifier transistor 114.

In the pixel PX, light incident on a silicon substrate of the pixel generates electron-hole pairs, and electrons in the pairs are accumulated in the node 115 by the photodiode 111.

When the transfer transistor 112 is turned on at a predetermined timing, the electrons are transferred to the node 116 to drive a gate of the amplifier transistor 114.

Thus, a signal charge is read as a signal to the output signal line 131.

The output signal line 131 may be grounded through a constant current source or a resistor device to perform a source follower operation, or may be temporarily grounded before reading and then be turned to a floating state to output a charge level set by the amplifier transistor 114.

The reset transistor 113 is turned on concurrently with turning on of the transfer transistor 112 to bring the electrons accumulated in the photodiode 111 to a power supply, thereby resetting the pixel to a dark state before accumulation, i.e., a state in which a photon is not incident.

It is to be noted that, in FIG. 4, PS represents a power supply used for resetting and a source follower, and, for example, 3 V may be supplied to the power supply PS.

A basic circuit or an operation mechanism of such a pixel PX is similar to a typical pixel, and the pixel PX may have variations.

However, the pixel assumed in this embodiment is designed to have extremely high conversion efficiency, compared to the typical pixel.

To do so, parasitic capacity of the input node 116 of the amplifier transistor 114 configuring a source follower may be preferably as small as possible, and an output signal obtained from one photon may be preferably sufficiently larger than random noise of the amplifier transistor 114.

Figure 5:
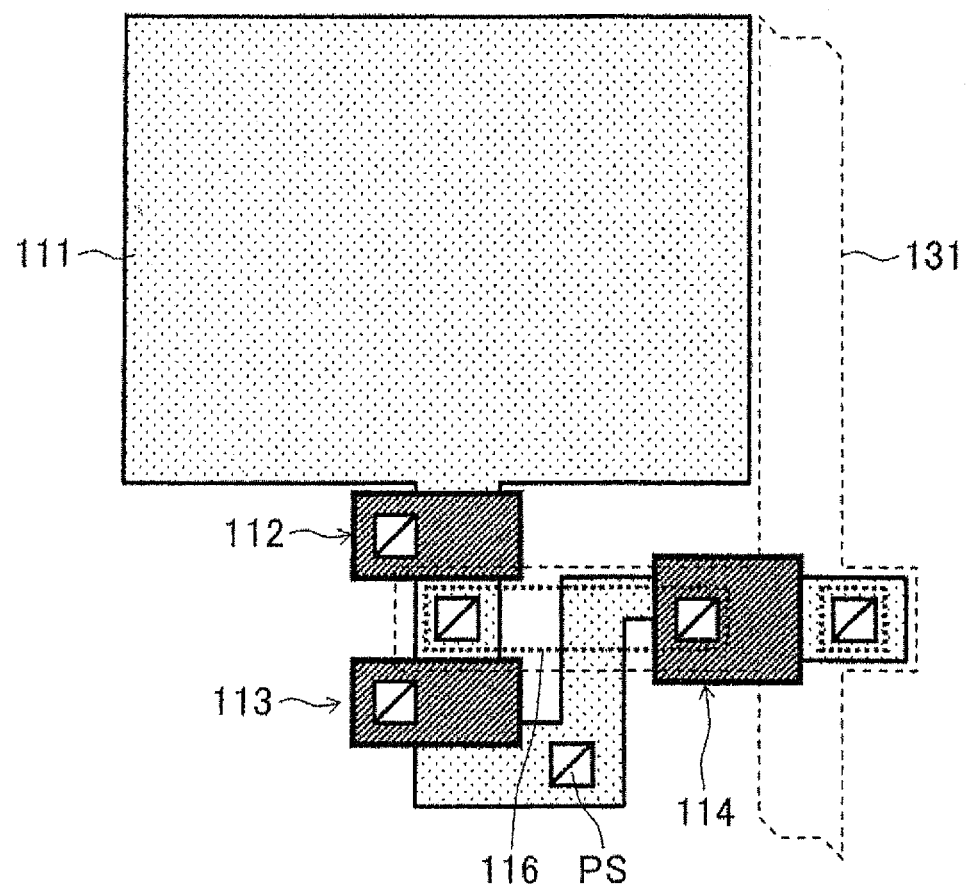
FIG. 5 is a diagram illustrating an example of a pixel layout.

FIG. 5 is a diagram illustrating an example of a pixel layout.

In FIG. 5, a diagonal line represents a gate electrode of a transistor, and a broken line represents a metal wiring line.

The input node 116 of the amplifier transistor 114 is configured of a diffusion layer section sandwiched between the transfer transistor 112 and the reset transistor 113, a gate section of the amplifier transistor 114, and a wiring section between them; however, each of these sections is arranged so as to have a minimum area. Moreover, while a drain width of the amplifier transistor 114 is reduced, a most part of the node 116 is flatly covered with a wiring line connected to the signal line 131 as a source output.

Since an output (on the signal line 131 side) of the source follower has a gain close to 1 with respect to an input from the input node 116, substantial parasitic capacity between them is extremely small.

Therefore, the parasitic capacity of the node 116 is minimized by adopting such a shield configuration, and conversion efficiency is allowed to be largely increased.

For example, in a case where the conversion efficiency is increased to 600 μV/e−, a signal amount is sufficiently larger than random noise of the amplifier transistor 114, and accordingly, one photon is allowed to be detected in principle.

In this case, when binary decision as to whether or not a photon is incident in a unit exposure period is performed to perform time-divisional photon counting, noise generated in the amplifier transistor 114 and the following devices is allowed to be reduced to substantially zero.

On the other hand, such a pixel is allowed to accumulate a charge of about 2000 e− in the photodiode 111, for example, with a power supply voltage of about 3 V. An output at this time is an analog output with an operation range of 1.2 V.

In this case, the upper limit of accumulation is defined by a range of an output signal; however, for example, an effective dynamic range is increased by four times by performing exposure and reading four times and integrating results.

In other words, as long as the conversion efficiency is sufficiently high, the output of such a pixel PX containing the photoelectric conversion device and the amplifier device may be treated as binary data or analog data with a gray scale.

It is to be noted that such characteristics are similar to those in a case where electron multiplication is performed in the pixel.

For example, as long as a multiplication factor is allowed to be controlled to be constant, even in an avalanche photodiode (APD) configured to perform electron multiplication in a photoelectric conversion device or a pixel configured to perform electron amplification with use of CCD transfer or the like in a process of transferring a charge to an amplifier device, an effect equivalent to that of a pixel with high conversion efficiency is obtained. In other words, the binary decision as to whether or not a photon is incident in the unit exposure period may be performed, and a signal by a charge group generated by further multiplying a plurality of charges generated by photoelectric conversion may be treated as analog data with a gray scale.

Figure 6:
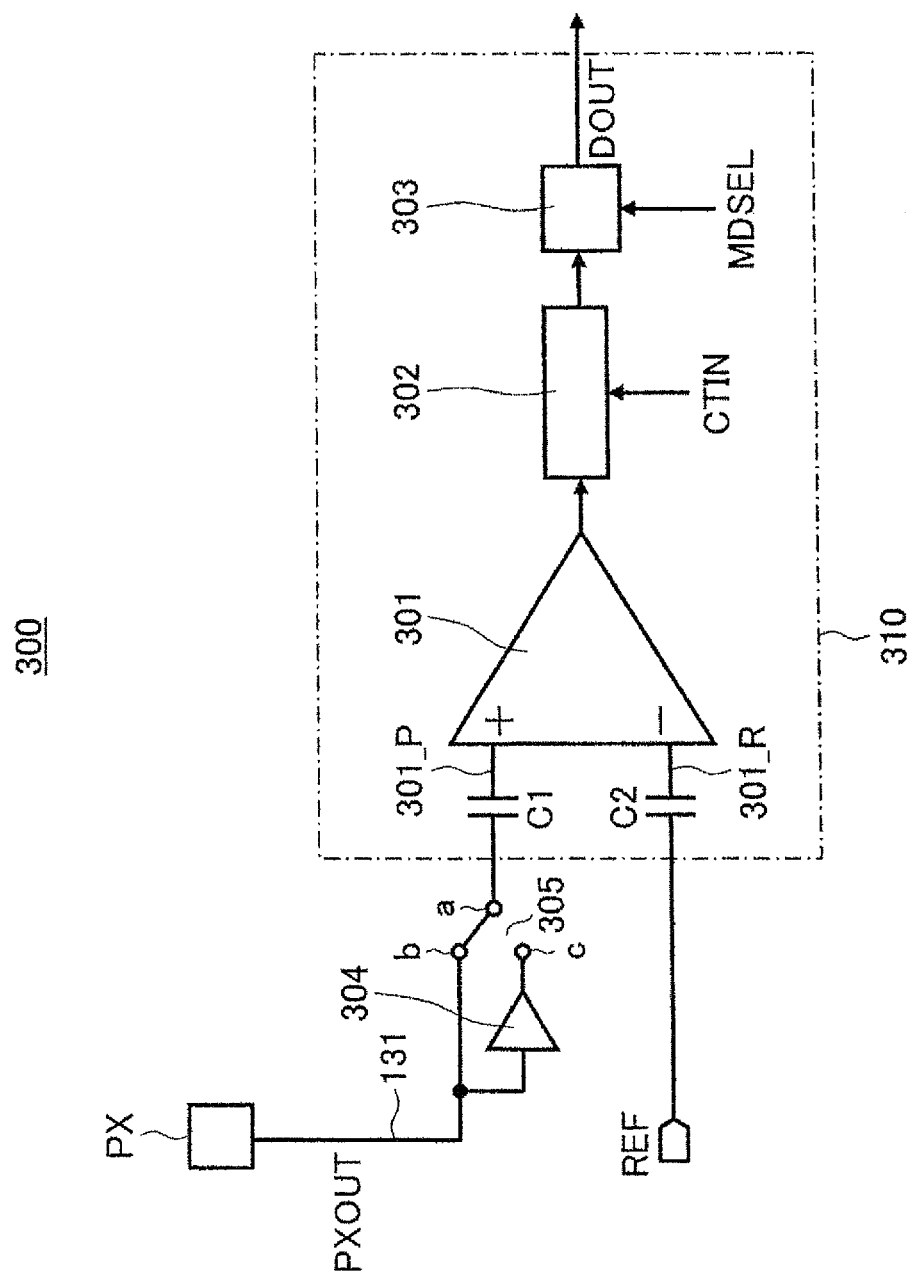
FIG. 6 is a diagram illustrating a configuration example of an AD conversion device in a sense circuit according to the first embodiment.

FIG. 6 is a diagram illustrating a configuration example of the AD conversion device in the sense circuit according to the first embodiment.

As illustrated in FIG. 6, an AD conversion device 300 includes a comparator 301, a counter 302, an output mode selection section 303, an amplifier 304, a switch 305, and capacitors C1 and C2.

Moreover, an AD converter (ADC) 310 is configured of, for example, the comparator 301, the counter 302, the output mode selection section 303, and the capacitors C1 and C2 enclosed by a broken line in FIG. 6, except for the amplifier 304 and the switch 305 of the AD conversion device 300.

In the comparator 301, a non-inverting input terminal (+) is connected to a terminal a of the switch 305 with the capacitor C1 in between, and an inverting input terminal (−) is connected to a supply line of a reference signal REF with the capacitor C2 in between.

The counter 302 and the output mode selection section 303 are cascaded to an output of the comparator 301.

A terminal b of the switch 305 is connected to the output signal line 131 configured to output a pixel signal PXOUT from a single pixel PX, and a terminal c of the switch 305 is connected to an output of the amplifier 304. An input of the amplifier 304 is connected to the output signal line 131.

The comparator 301 performs a comparison between the pixel signal PXOUT that is not amplified by the amplifier 304 or the pixel signal PXOUT that is amplified by the amplifier 304 and the reference signal REF.

The counter 302 has a clock gate function of blocking a clock CTIN upon reception of an output result from the comparator 301 to stop counting.

In the AD conversion device 300 according to this embodiment, the output mode selection section 303 configured to perform outputting, based on an output mode selection signal MDSEL is added on an output side of the counter 302.

Further, the amplifier 304 with a gain (G)>1 is connected to the output of the pixel, as necessary.

Figure 7:
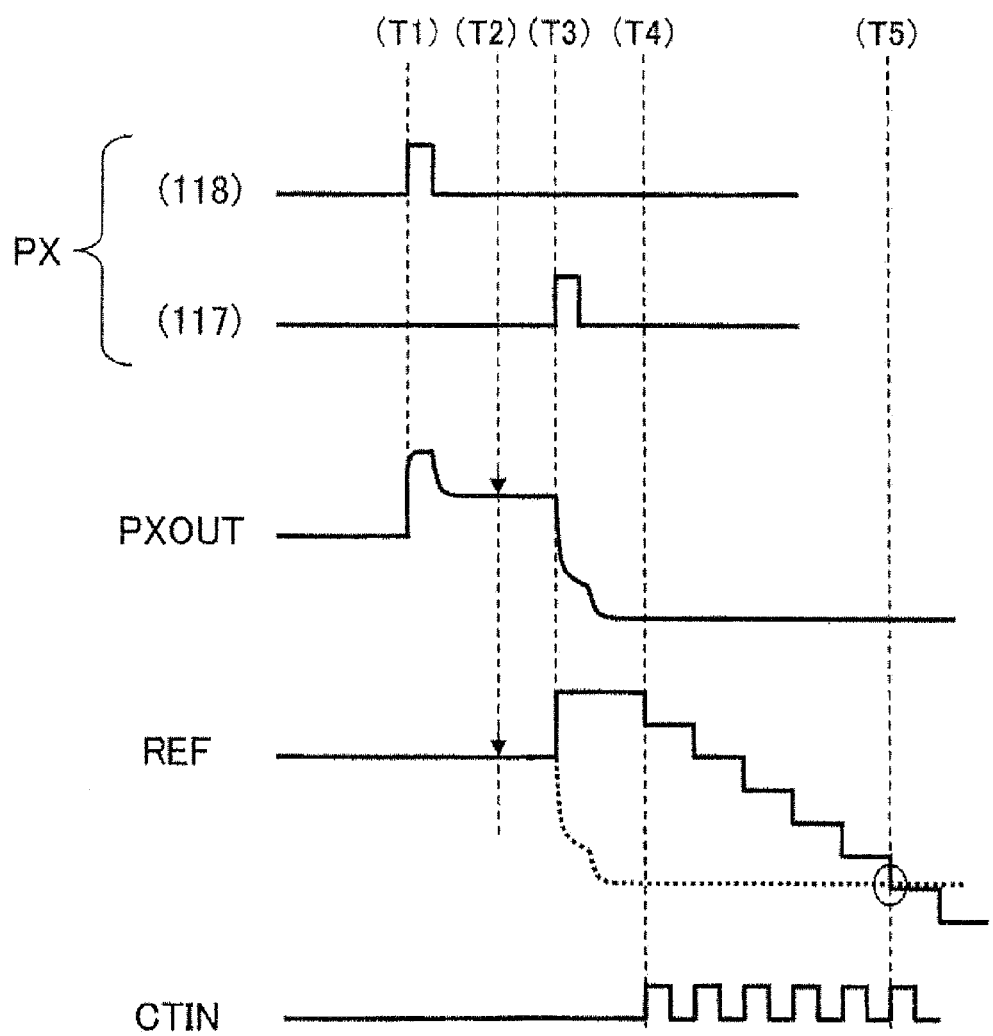
FIG. 7 is a diagram illustrating an example of an operation waveform of the AD conversion device in FIG. 6.

FIG. 7 is a diagram illustrating an example of an operation waveform of the AD conversion device in FIG. 6.

An operation procedure of the AD conversion device in FIG. 6 will be described below referring to FIG. 7.

[Timing T1]

At a timing T1, a pulse is applied to a gate of the reset transistor 113 in the pixel PX in FIG. 4, and a signal PXOUT at a reset level is output from the pixel PX.

[Timing T2]

At a timing T2, an input stage of the comparator 301 holds a charge for cancelling the above-described reset signal to execute so-called CDS (correlated double sampling).

For example, in Japanese Unexamined Patent Application Publication No. 2008-193373, as "auto-zero", the input and an internal node of the comparator 301 are short-circuited, and a charge is distributed between input nodes 301_P and 301_R so as to allow both inputs to the comparator 301 to be balanced, and is then stored in the input nodes 301_P and 301_R.

[Timing T3]

At a timing T3, a pulse is supplied to the gate of the transfer transistor 112 in the pixel PX in FIG. 4, and the pixel signal PXOUT is output from the pixel PX.

On the other hand, a certain offset is added to the reference signal REF in a negative signal direction to stabilize the output of the comparator 301 to one side.

[Timing T4]

At a timing T4, while the reference signal REF is supplied as a stepwise pulse, a pulse in synchronization with the reference signal REF is supplied to the counter 302, thereby allowing the counter 302 to count up.

[Timing T5]

At a timing T5, when the level of the reference signal REF exceeds a balance state at the timing T2 relative to the pixel signal PXOUT, the output of the comparator 301 is inverted, and the counter 302 stops counting up accordingly, and the state is maintained.

An output value of the counter 302 obtained in such a manner linearly reflects a difference between the pixel signal PXOUT output to the output signal line 131 and the reset signal.

At this time, the output mode selection section 303 selects an output DOUT, based on the value of the output mode selection signal MDSEL in the following manner.

First, in a case of a binary output, if the output value of the counter 302 exceeds a certain threshold value, "1" is output, and if not, "0" is output.

On the other hand, in a case of a multi-bit output, a value obtained by subtracting a count for the offset added at the timing T3 from a counter value is output.

The above-described AD conversion device is an example of a simplest AD conversion device adopted in this embodiment.

Incidentally, a typical AD conversion device (AD converter) is capable of performing conversion at higher speed with lower bit resolution. In this example, this is reflected in a count period.

For example, in a case where a step of a stepwise pulse is 30 µV, one photon signal in a pixel with conversion efficiency of 600 µV/e− is equivalent to 20 counts on average.

Therefore, in a perfect comparator, decision is possible when about 10 counts are added to the count for the offset at the timing T3, and if the comparator is inverted, a result is "0" (no photon is incident), and if not, the result is "1" (a photon is incident).

Alternatively, when the step of the stepwise pulse is 600 µV, and an offset amount at the timing T3 is 300 µV, a decision is allowed to be performed with one count at minimum.

On the other hand, gray-scale decision is performed on a signal amount equivalent to a large number of photons, at least 256 counts is necessary for 8-bit gray scale, and at least 1024 counts are necessary for 10-bit gray scale.

Typically, when bit resolution is low, reading is allowed to be executed at high speed, and a frame rate is allowed to be increased accordingly. In particular, as will be described later, reading of a plurality of pixels is cycled by a rolling shutter, reading speed is directly related to the frame rate.

Therefore, in a case where the bit resolution is low, reading is performed a large number of times by increasing the frame rate, and an output value is added in each pixel, thereby enabling to compensate for substantial bit resolution.

Time-divisional photon counting is a typical example, and more typically, it is easy to provide the following modes to an image pickup unit. More specifically, it is easy to provide, to a same image pickup unit, the following modes:

a mode in which exposure and reading are executed a large number of times at low bit resolution, and results are integrated to determine light intensity by calculation, and a mode in which exposure and reading are executed a small number of times at high bit resolution, and results are integrated to determine light intensity by calculation.

Therefore, for output by multi-bit resolution, more modes may be provided.

Incidentally, the comparator 301 typically has an offset caused by variations in a transistor configuring the comparator 301, and the offset causes variations in each comparator at a inverting timing, thereby causing fixed noise.

As a method of cancelling out such noise, a method in which the above-described AD conversion is performed in a dark-signal or no-signal state in which light is blocked, and a counter value in each comparator 301 is stored, and a difference between the counter value and a pixel signal is determined.

For example, a case where these are performed in each frame as calibration is described in Japanese Unexamined Patent Application Publication No. 2006-20173.

Alternatively, the following technique is described in Japanese Unexamined Patent Application Publication No. 2005-323331.

More specifically, there is described a technique in which a stepwise pulse of the reference signal REF is applied in each of pixel resetting and reading, and a difference is determined with use of a combination of down-counting and up-counting of a counter to concurrently execute CDS of the reset signal and cancellation of the offset.

Alternatively, in Japanese Unexamined Patent Application Publication No. 2008-193373, in a step described above as "auto-zero", CDS of the reset signal is executed. Then, first application of the stepwise pulse and down-counting that are performed following the step are equivalent to offset calibration with no signal in each TOW.

Alternatively, instead of subtraction of the counter value, a bias for cancellation corresponding to the offset of each comparator may be added to the reference signal REF.

It is to be noted that it is necessary to execute such an offset cancellation process before binary decision. Therefore, it is necessary to execute the process before the output mode selection section 303 executes output mode selection.

Alternatively, to relatively reduce an influence of the offset of the comparator 301, the output of the pixel PX may be amplified with a gain (G) greater than 1 with use of the amplifier 304, and this process is effective specifically in binary decision.

In a case where multi-bit decision is performed with use of a pixel signal XPOUT as an analog signal, a maximum value of the number of detected electrons is limited by an output range; therefore, when the pixel output is amplified, the maximum value is more tightly limited, thereby reducing the number of detectable electrons.

On the other hand, a threshold decision value of the pixel signal in binary decision is sufficiently small; therefore, such limitation is not imposed. Thus, it is desirable to amplify the pixel output (with the gain G>1) by the amplifier 304 only in binary decision.

For example, when the signal is amplified with a gain of 8 times, the influence of the offset of the comparator 301 is allowed to be reduced to $\frac{1}{8}$.

Typically, when the pixel output is amplified, all of various noise factors such as offset and random noise that the AD conversion device has are allowed to be relatively reduced.

It is to be noted that the offset that the amplifier 304 has is not an issue, because the offset is cancelled out when CDS is performed in a later stage.

Moreover, as will be described later, the amplifier 304 is allowed to be arranged common to a plurality of pixels; therefore, when a certain size occupied by the amplifier 304 is secured, random noise that the amplifier 304 has is allowed to be sufficiently reduced.

It is to be noted that, in a case where such a single-slope AD conversion device is used, when the pixel output signal is amplified with a gain of N times, a threshold binary decision value is increased by about N times; therefore, it is desirable to increase a step width of the reference signal REF by about N times to increase speed.

Next, a configuration in which an AD conversion device of the sense circuit 121 is shared by a plurality of pixels PX will be described as a second embodiment.

3. Second Embodiment

Figure 8:
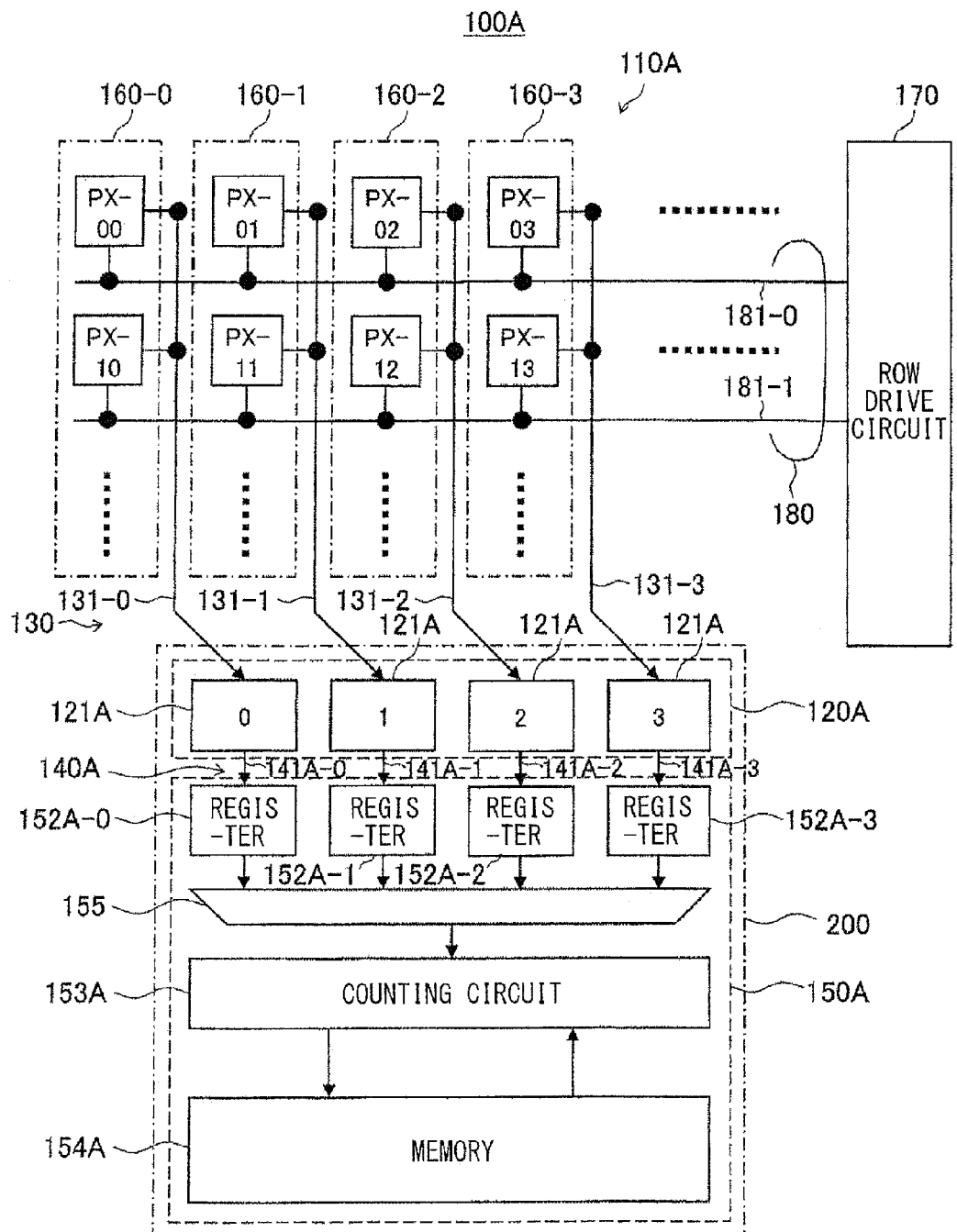
FIG. 8 is a diagram illustrating a configuration example of a CMOS image sensor (image pickup device) according to a second embodiment.

FIG. 8 is a diagram illustrating a configuration example of a CMOS image sensor (an image pickup device) according to the second embodiment.

In the CMOS image sensor 100 according to the first embodiment, the pixels PX and the sense circuits 121 correspond to each other on a one-to-one basis.

However, an area occupied by the pixels PX and an area occupied by the sense circuits 121 are not necessarily equal to each other.

Moreover, in lamination of two substrates, a counting circuit or a memory with a large circuit scale may be disposed outside a pixel array region, and long-distance transfer of data from each sense circuit 121 at high speed is desirable, and is likely to be restricted in layout.

A CMOS image sensor 100A according to the second embodiment provides a flexible solution to the above-described issue by sharing one sense circuit (AD conversion device) by a plurality of pixels.

In the CMOS image sensor 100A according to this embodiment, the amplifier 304 of the AD conversion device is shared by a plurality of pixels.

In the CMOS image sensor 100A, a pixel array section 110A includes a plurality of pixels PX arranged along a row direction and a column direction in a matrix form.

Each of pixel blocks 160-0 to 160-3, . . . is configured of a plurality of pixels PX in a same column and a selection circuit.

The CMOS image sensor 100A includes a row drive circuit 170 configured to drive the pixels PX of the pixel array section 110A to output electrical signals of the pixels PX to the output signal line 131, and a row control line group 180.

The CMOS image sensor 100A includes a circuit block 200 configured to perform binary decision on the electrical signals transmitted through the output signal line 131, and to integrate decision results from each pixel a plurality of times to generate two-dimensional image pickup data with a gray scale.

In the circuit block 200, a sense circuit section 120A and a decision result integrated circuit section 150A are disposed.

In the sense circuit section 120A, sense circuits 121-0, 121-1, 12-2, 121-3, . . . are disposed corresponding to the pixel blocks 160-1 to 160-3, . . . of the pixel array section 110A, respectively.

An input of the sense circuit 121-0 is connected to an output signal line 131-0 to which outputs of all of the pixels PX-00, and PX-10 to (PX-150) forming the pixel block 160-0 are connected.

In other words, one sense circuit 121-0 is shared by a plurality of pixels PX-00 to (PX-150).

An input of the sense circuit 121-1 is connected to an output signal line 131-1 to which outputs of all of the pixels PX-01, and PX-11 to (PX-151) forming the pixel block 160-1 are connected.

In other words, one sense circuit 121-1 is shared by a plurality of pixels PX-01 to (PX-151).

An input of the sense circuit 121-2 is connected to an output signal line 131-2 to which outputs of all of the pixels PX-02, and PX-12 to (PX-152) forming the pixel block 160-2 are connected.

In other words, one sense circuit 121-2 is shared by a plurality of pixels PX-02 to (PX-152).

An input of the sense circuit 121-3 is connected to an output signal line 131-3 to which outputs of all of the pixels PX-03, and PX-13 to (PX-153) forming the pixel block 160-3 are connected.

In other words, one sense circuit 121-3 is shared by a plurality of pixels PX-03 to (PX-153).

In the sense circuit section 120A, a sense circuit is arranged so as to be shared by a plurality of pixels of each of other pixel blocks that are not illustrated.

The decision result integrated circuit section 150A has a function of integrating decision results from each pixel by the sense circuits 121-1 to 121-3 a plurality of times to generate two-dimensional image pickup data with a gray scale.

The decision result integrated circuit section 150A includes registers 152A-0 to 152A-3, a selection circuit 155, a counting circuit 153A, and a memory 154A.

The registers 152A-0 to 152A-3 hold decision values of the corresponding sense circuits 121-0 to 121-3 transferred through the transfer lines 141A-0 to 141A-3, respectively.

The selection circuit 155 sequentially selects outputs of the registers 152A-0 to 152A-3, and supplies the decision values held by the registers 152A-0 to 152A-3 to the counting circuit 153A.

The counting circuit 153A sequentially performs a counting process on decision values of a plurality of pixels (in this example, four pixels) in a row selected to be read through the selection circuit 155, and stores a counting result for each of the pixels in the memory 154A.

Data of the pixels at the time of previous reading is loaded from the memory 154A to the counting circuit 153A.

The decision result integrated circuit section 150A according to the second embodiment includes one counting circuit 153A, and the counting circuit 153A is shared by a plurality of registers 152A-0 to 152A-3.

In other words, in the CMOS image sensor 100A according to the second embodiment, the counting circuit 153A is shared by a plurality of sense circuits 121A-0 to 121A-3.

Figure 9:
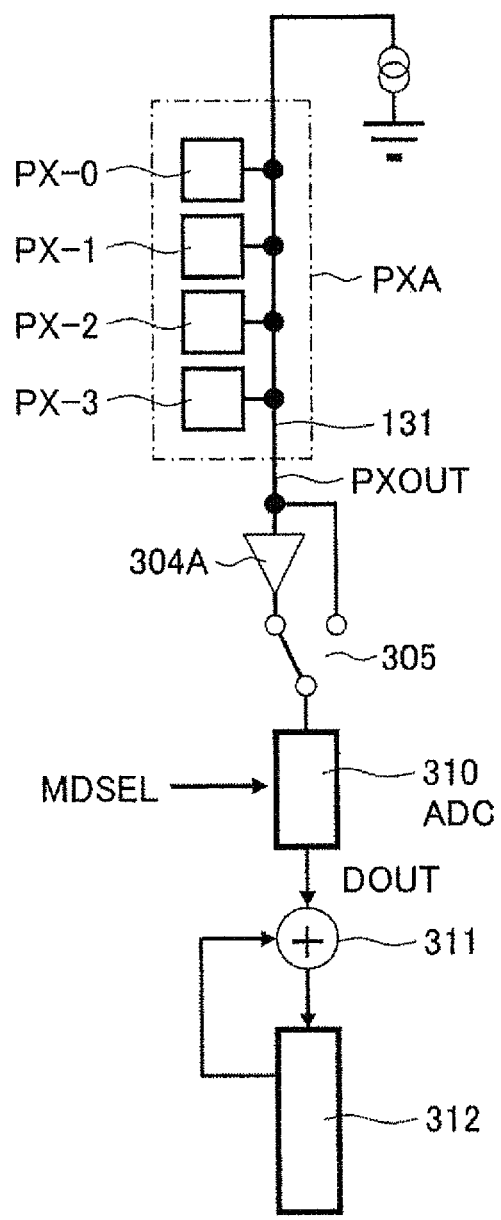
FIG. 9 is a diagram illustrating a configuration example of an AD conversion device in a sense circuit according to the second embodiment.

FIG. 9 is a diagram illustrating a configuration example of the AD conversion device in the sense circuit according to the second embodiment.

Figure 10:
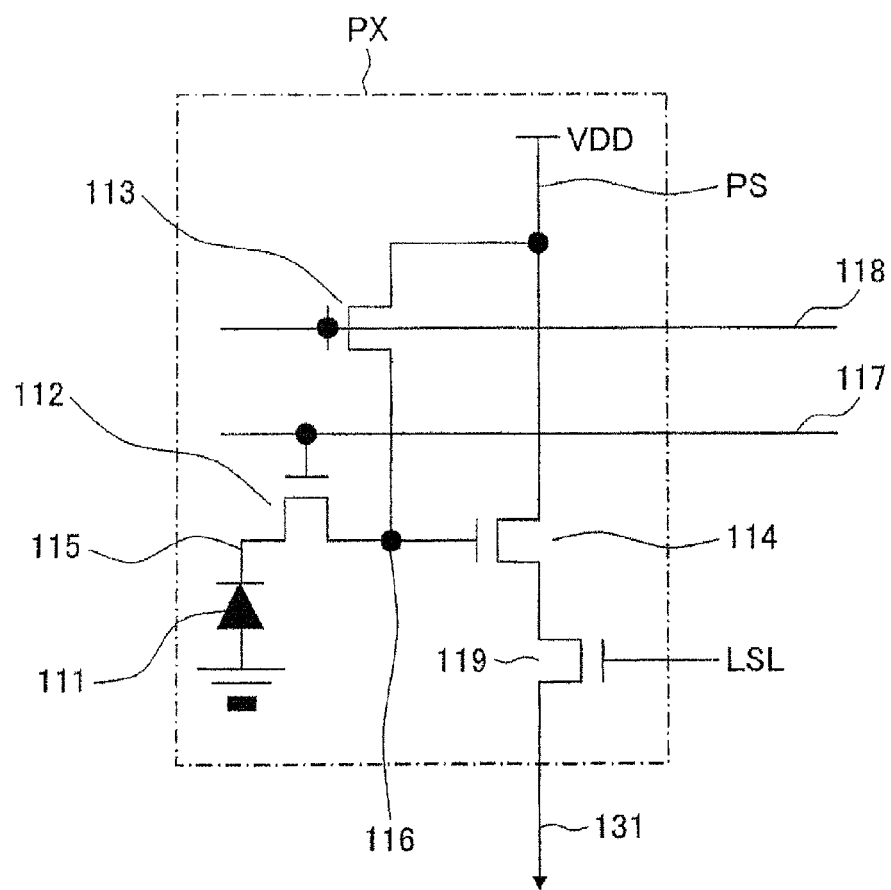
FIG. 10 is a diagram illustrating an example of a circuit configuration of a pixel according to the second embodiment.

FIG. 10 is a diagram illustrating an example of a circuit configuration of a pixel according to the second embodiment.

The AD conversion device 310 in FIG. 9 is a configuration example in which the AD conversion device is connected to a plurality of pixels.

In this case, in a pixel array PXA (the pixel block 160 in FIG. 8), pixels PX-0 to PX-3 with high conversion efficiency are connected to a same output signal line 131 through for example, the selection transistor 119 as illustrated in FIG. 10. A gate of the selection transistor 119 is connected to a selection control line LSL.

In FIG. 9, the AD conversion device 300A may include, for example, the ADC 310 including the comparator 301, the counter 302, and the output mode selection section 303 that are included in the AD conversion device 300 in FIG. 6, a column amplifier 304A, and a switch 305.

The ADC 310 includes an output mode selection section configured to allow selection between binary output and multi-bit output, based on the output mode selection signal MDSEL.

The column amplifier 304A represents a column amplifier with a gain G>1.

Thus, in the second embodiment, the ADC 310 and the column amplifier 304A are shared by a plurality of pixels.

The AD conversion device 300A in FIG. 9 further includes an adder 311 and a memory 312.

The memory 312 holds light intensity of each pixel in a digital form.

An output signal from a selected pixel is AD-converted into a one-bit or a multi-bit gray scale, based on an output mode specified by the output mode selection signal MDSEL in the ADC 310, and is output as an output signal DOUT.

Data corresponding to the selected pixel is read from the memory 312, and an output is added to the data by the adder 311, and a result from the adder 311 is stored in the memory 312 again.

In a case where the one-bit output mode is selected by the output mode selection signal MDSEL, a signal output of the selected pixel generated in the output signal line 131 of the pixel is input to the ADC 310 through the column amplifier 304A.

On the other hand, in a case where the multi-bit output mode is selected, the pixel signal PXOUT of the output signal line 131 is input to the ADC 310 not through the column amplifier 304A but through the switch 305.

Alternatively, in this case, the gain G of the column amplifier may be changed to 1 or less.

It is to be noted that the pixels PX-0 to 1 and the AD conversion device may have variations.

The present technology is made to improve a dynamic range of image pickup with use of a phenomenon in which a signal output substantially proportional to the number of incident photons is obtained in a case where a plurality of photons are incident in an exposure period even in various kinds of pixels having high conversion efficiency with which one photon is detectable or a function of multiplying electrons in a pixel.

As a specific example, an output selection section configured to allow selection between the one-bit output and the multi-bit output is disposed in the AD conversion device.

As an example of the AD conversion device, a single-slope AC conversion device is illustrated in FIG. 6; however, any of AD conversion devices such as a successive approximation type and a cyclic type is capable of performing a binary output by providing a threshold decision value, and such an output selection means is allowed to be provided.

Alternatively, different conversion systems may be used for binary output and multi-bit output.

In other words, an application range of the present technology is not limited to the single-slope AD conversion device.

Moreover, the adder 311 may be shared by a plurality of ADCs. A plurality of modes are considered as a chip configuration of the image pickup unit, and the adder 311 and the memory 312 may be mounted in an image pickup chip, or an image pickup chip may output a signal corresponding to the output signal DOUT, and the adder 311 and the memory 312 may be mounted in a signal processing chip following the image pickup chip.

FIGS. 11(A) and (B) are diagrams illustrating an example in which four pixels in FIG. 9 are accessed with use of a rolling shutter.

Figure 11:
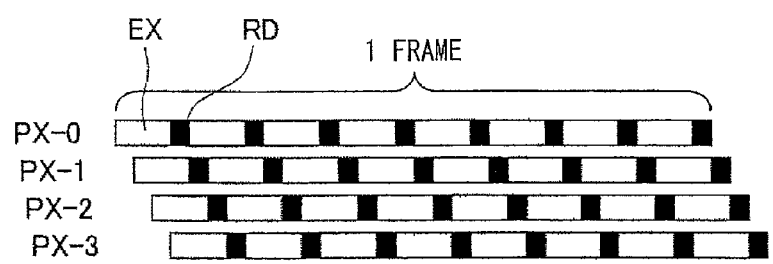
FIG. 11 is a diagram illustrating an example in which four pixels in FIG. 9 are accessed with use of a rolling shutter.
Figure 11:
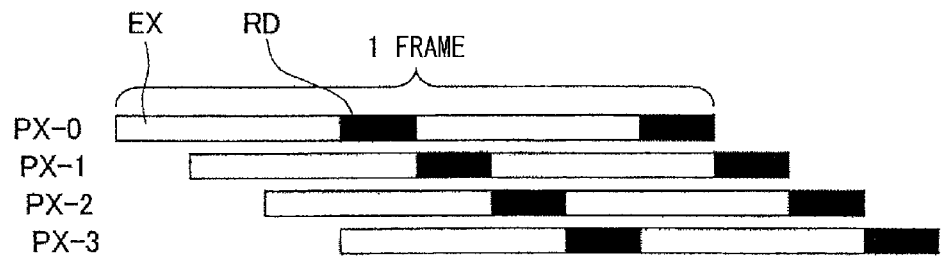

In FIG. 11, a white portion indicated by a reference numeral EX represents an exposure period, and a black portion indicated by a reference numeral RD represents a reading period.

The pixels connected to a same output signal line 131 are sequentially selected and circularly read, and exposure is performed out of the reading periods.

The exposure period EX may be further adjusted by an electronic shutter or the like. Typically, when the bit resolution of the AD conversion device is low, the reading period is shortened, and is cycled at high speed; therefore, a large number of exposures are allowed to be performed in a same period (for example, in one frame).

FIG. 11(A) illustrates an example of one-bit output, and one frame is configured of eight exposure periods and eight reading periods. Light intensity is determined by adding 8 sets of binary data, and a result of addition is equal to an about 3-bit gray scale.

FIG. 11(B) illustrates an example of a multi-bit output, and one frame is configured of two exposure periods and two reading periods. When an about 3-bit gray scale is output from the AD conversion device in each exposure period, light intensity is output as addition of two outputs, and a result of addition is equal to an about 4-bit gray scale.

It is to be noted that, in the multi-bit gray-scale output mode, various modes such as a mode of adding a large number of exposure results at low bit resolution, a mode of adding one exposure result or a small number of exposure results at high bit resolution may be provided together.

Incidentally, to obtain a gray scale from results of binary decision as to whether or not a photon is incident on respective pixels in an exposure period, in addition to the above-described time-dimensional photon counting, a method using surface-divisional photon counting may be adopted.

In other words, a gray scale may be obtained by considering an array of a plurality of pixels as a single light reception surface, and adding results.

For example, when an array of 128×128 pixels configures a chip, and serves as one light reception surface, the array is allowed to be used as an alternative to a photomultiplier.

Moreover, for example, in a case where intensity of light instantly emitted from a scintillator receiving X-ray of one photon is measured, when decision data "1"s are counted from 128×128 pixels, 16,384 gray scales corresponding to a 14-bit gray scale are allowed to be obtained.

Figure 1:
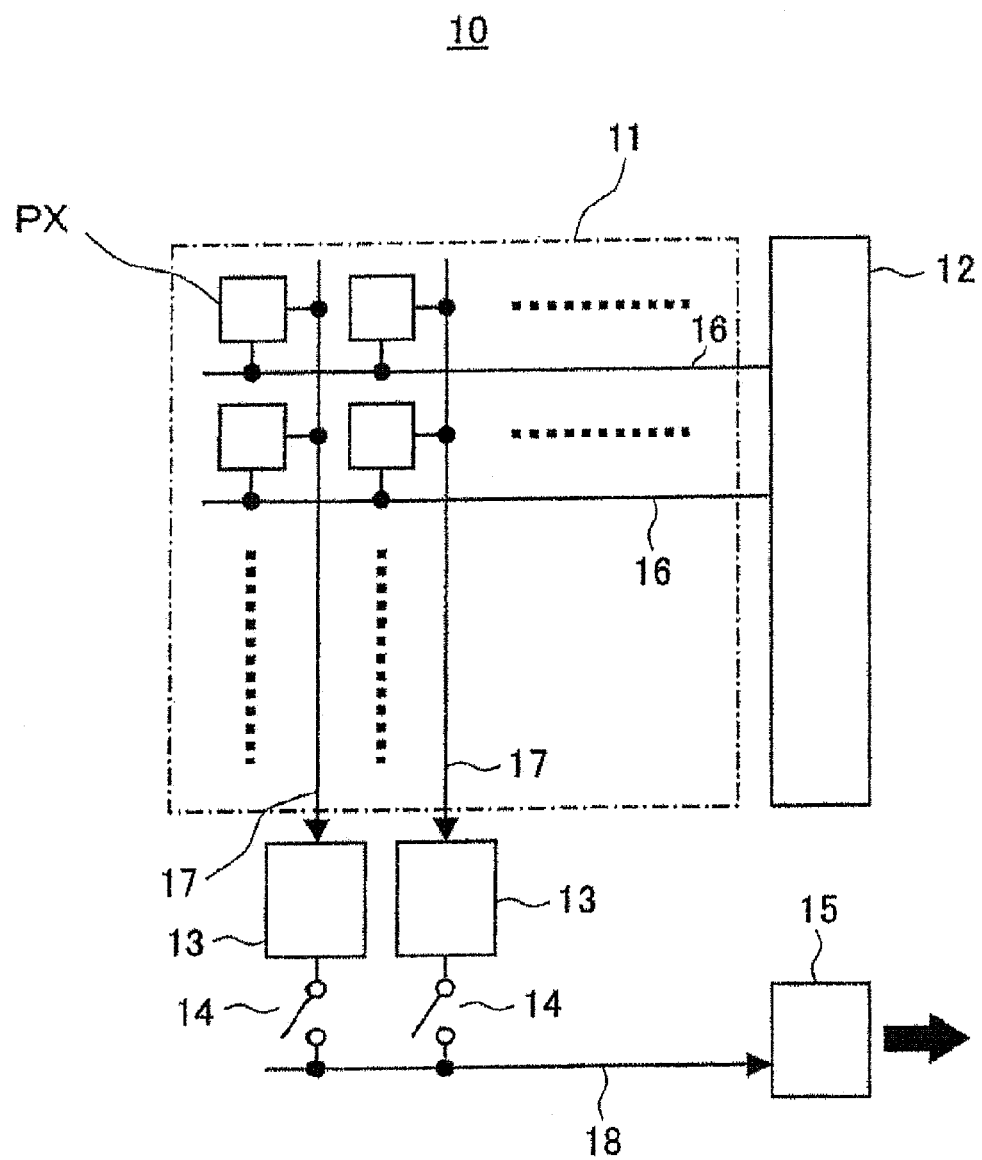
FIG. 1 is a diagram illustrating a typical chip configuration of a CMOS image sensor as a solid-state imaging device.
Figure 2:
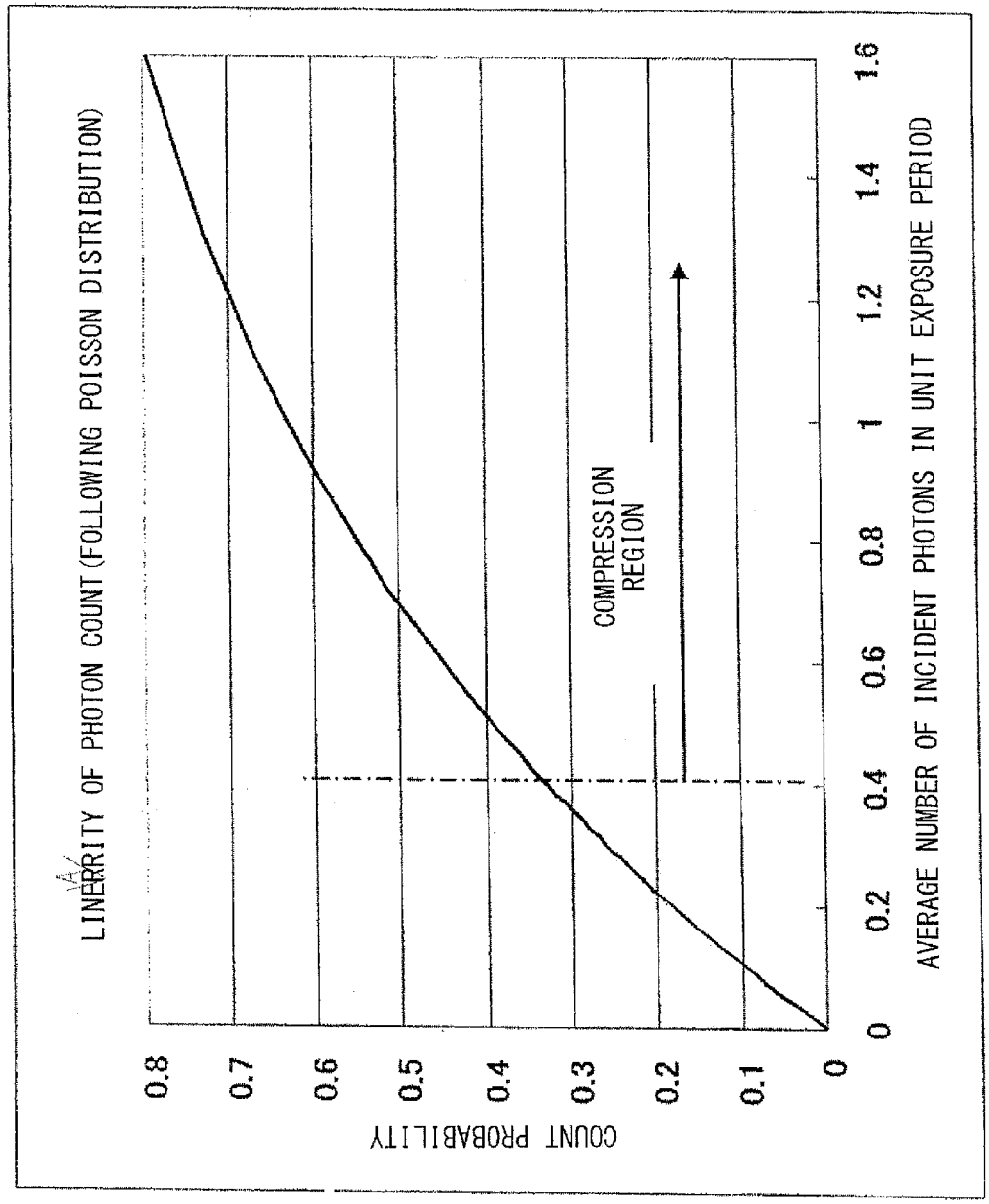
FIG. 2 is a diagram illustrating an example of the average number of incident photons in a unit exposure period and count probability (the average number of counts per unit exposure period).

Also in this case, when a light emission position is random or a photon is reflected or diffracted to be randomly scattered, the number of received photons and the number of counts follow the Poisson distribution in FIG. 2. Moreover, when intensity of received light is high, the number of photon-counting misses is increased, thereby causing deterioration in image pickup precision.

Therefore, even in such a case, it is effective to have the binary decision mode and the multi-bit gray-scale output mode in the AD converter connected to the pixel output, and while ultra-low light is precisely counted, the dynamic range of image pickup is allowed to be remarkably improved.

Each of the image pickup devices according to the above-described embodiments is applicable as an image pickup device of a digital camera and a video camera.

3. Camera System

Figure 12:
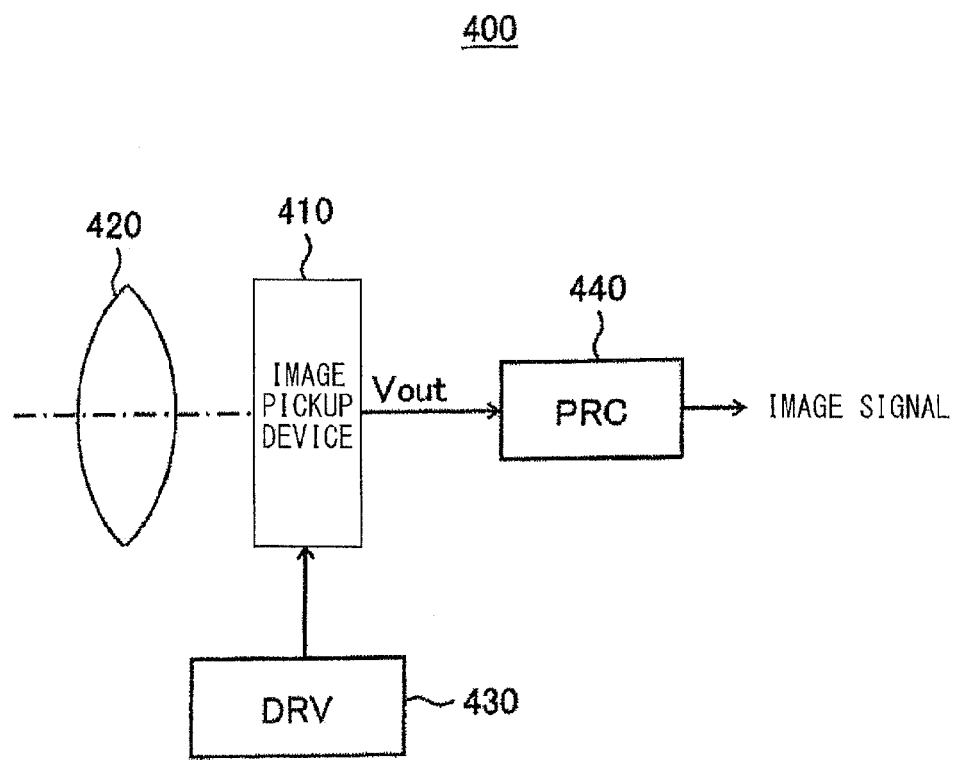
FIG. 12 is a diagram illustrating an example of a configuration of a camera system to which any of the solid-state image pickup devices according to the embodiments is applied.

FIG. 12 is a diagram illustrating an example of a configuration of a camera system to which any of the solid-state image pickup devices according to the embodiments is applied.

As illustrated in FIG. 12, a camera system 400 includes an image pickup device 410 to which any of the CMOS image sensors (the solid-state image pickup devices) 100 and 100A according to the embodiments is applicable.

The camera system 400 includes an optical system configured to guide incident light to a pixel region of the image pickup device 410 (configured to form an image of a subject), for example, a lens 420 configured to form an image of the incident light (image light) on an image pickup plane.

The camera system 400 further includes a drive circuit (DRV) 430 configured to drive the image pickup device 410 and a signal processing circuit (PRC) 440 configured to process an output signal of the image pickup device 410.

The drive circuit 430 includes a timing generator (not illustrated) configured to generate various timing signals including a start pulse and a clock pulse for driving of a circuit in the image pickup device 410, and drives the image pickup device 410 at a predetermined timing signal.

Moreover, the signal processing circuit 440 applies predetermined signal processing on the output signal of the image pickup device 410.

An image signal processed by the signal processing circuit 440 is recorded on a recording medium such as a memory. A hard copy of image information recorded on the recording medium is produced by a printer or the like. Further, the image signal processed by the signal processing circuit 440 is displayed as a moving image on a monitor configured of a liquid crystal display or the like.

As described above, in an image pickup unit such as a digital still camera, a camera with low power consumption and high precision is achievable by including the above-described image pickup device 100 or 100A as the image pickup device 410.

Moreover, the image pickup devices 100 and 100A according to the embodiments are most advantageous for one-bit output by binary decision at ultra-low illuminance.

However, in a case where average illuminance of the subject is increased and the average number of incident photons in a unit exposure period in FIG. 2 is increased to noticeably compress an output, it is desirable to switch to the multi-bit output mode.

Switching between the modes may be automatically performed by using pixels in a fixed region as monitor pixels and calculating average light intensity of the pixels, or may be manually performed while a user is monitoring an image.

Cases of mode switching may include the following application.

For example, there are various phenomena in which, when a biological cell in a specific condition is irradiated with light with a specific wavelength, the biological cell generates extremely weak fluorescence. These phenomena are used for various condition observations of living bodies such as cancer cell detection by an endoscope; however, different image pickup devices are typically used for fluorescence detection and image pickup of a living body.

For example, an image of fluorescence generated directly after irradiation with a light pulse is picked up in a dark state with use of a multiplying CCD camera or the like, and an image of a living body is picked up in a state where light is applied with use of a typical image pickup unit, and both of image pickup results are superimposed on each other to determine a position where the fluorescence is generated.

In the image pickup devices according to the embodiments, the one-bit output mode is used to observe fluorescence, and the multi-bit output mode is used to pick up an image of the living body; therefore, both the fluorescence and living body are allowed to be observed by one image pickup device. It is not necessary to align two image pickup results, and the position of fluorescence is detected precisely at low cost.

4. Application to Endoscope

Figure 13:
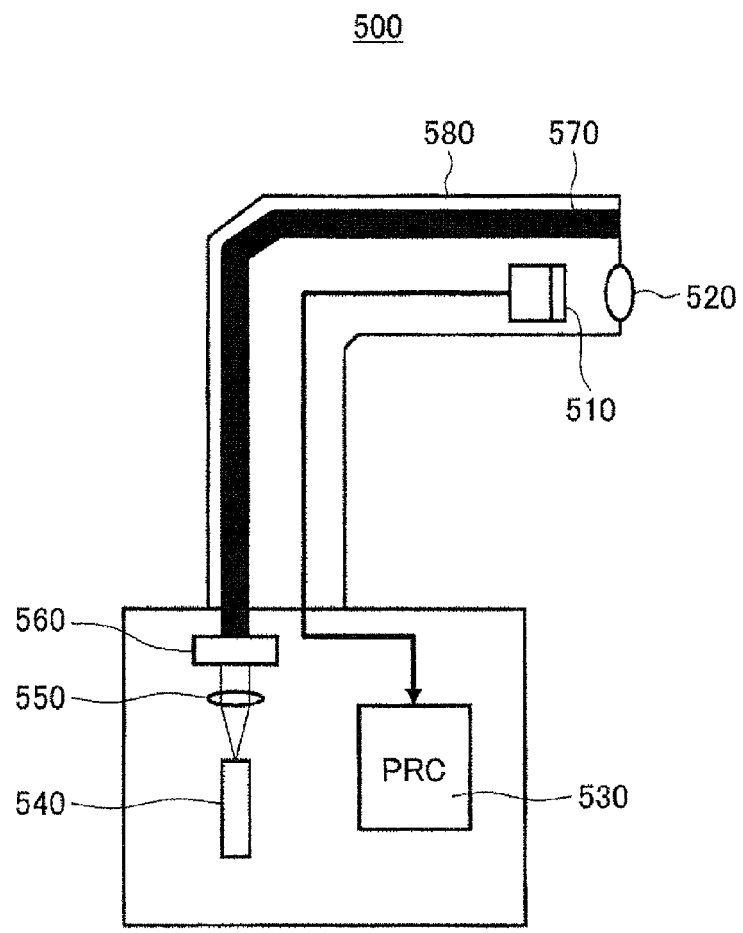
FIG. 13 is a diagram illustrating an example of a configuration in which any of the solid-state image pickup devices according to the embodiments is applied to an endoscope.

FIG. 13 is a diagram illustrating an example of a configuration in which any of the solid-state image pickup devices according to the embodiments is applied to an endoscope.

As illustrated in FIG. 13, an endoscope 500 includes a sensor 510 to which any of the CMOS image sensors (the solid-stat image pickup devices) 100 and 100A according to the embodiments is applicable.

The endoscope 500 includes an optical system configured to guide incident light to a pixel region of the sensor 510 (configured to form an image of a subject), for example, a converging lens 520 configured to form an image of incident light (image light) on an image pickup plane.

Moreover, the endoscope 500 includes a signal processing circuit (PRC) 530 configured to process an output signal of the sensor 510.

The endoscope 500 includes a white light source 540 configured to apply light to a subject to be tested, a converging lens 550, a filter switching device 560, an optical fiber 570 configured to propagate light from the white light source 540.

The sensor 510, the converging lens 520, and the optical fiber 570 are contained in a cable 580.

In the endoscope 500, only light with a specific wavelength is applied in fluorescence observation; therefore, a filter is set to the light source 540 by the filter switching device 560.

Figure 14:
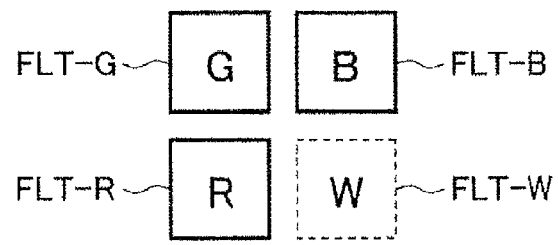
FIG. 14 is a diagram illustrating an example of an on-chip color filter of a sensor (image pickup device) applied to the endoscope in FIG. 13.

FIG. 14 is a diagram illustrating an example of an on-chip color filter of the sensor (the image pickup device) applied to the endoscope in FIG. 13.

The on-chip color filter of the sensor 510 illustrated in FIG. 14 includes R (red), G (green), and B (blue) filters FLT-R, FLT-G, and FLT-B.

In fluorescence observation, only a W (white) filter FLT-W that is not included in the on-chip filter is used.

In the endoscope 500, any of the image pickup devices according to the embodiments is applied as the sensor, and the one-bit output mode is used to observe fluorescence, and the multi-bit output mode is used to pick up an image of the living body; therefore, both the fluorescence and living body are allowed to be observed by one image pickup device. It is not necessary to align two image pickup results, and the position of fluorescence is detected precisely at low cost.

5. Application to Radiation Detector

Figure 15:
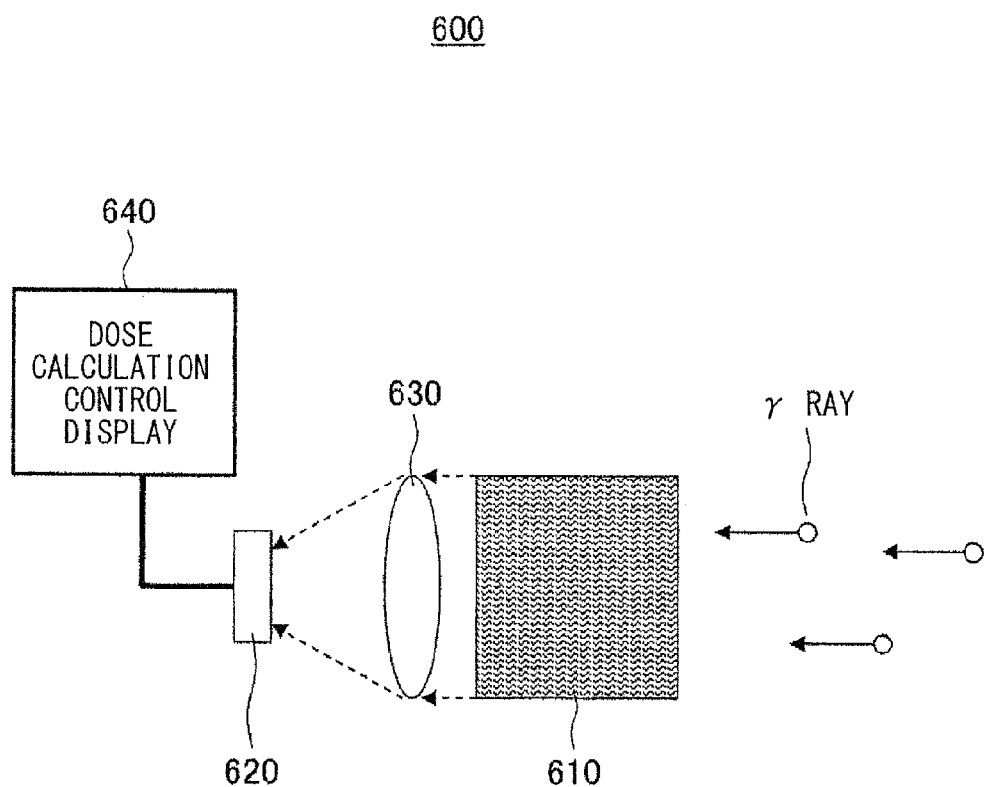
FIG. 15 is a diagram illustrating an example of a configuration in which any of the solid-state image pickup devices according to the embodiments is applied to a radiation detector.

FIG. 15 is a diagram illustrating an example of a configuration in which any of the solid-state image pickup devices according to the embodiments is applied to a radiation detector.

Moreover, as illustrated in FIG. 15, the image pickup device of the present technology may be used in combination with a scintillator 610 in a radiation detector 600.

As illustrated in FIG. 15, the radiation detector 600 includes an image pickup device (sensor) 620 to which any of the CMOS image sensors (the solid-state image pickup devices) 100 and 100A according to the embodiment is applicable.

For example, when a γ ray is incident on the scintillator 610 using NaI or the like, scintillation light as weak visible light is generated. The amount of the light is measured with use of the image pickup device 620.

In this case, a control device 640 including a dose calculation section, a control section, a display section, and the like calculates a dose from the total number of effective pixels on which scintillation light is incident in a certain exposure period through a converging lens 630 in the image pickup device 620.

First, photon counting is performed in a binary mode, and when the dose exceeds a certain level, the mode is turned to the multi-bit gray-scale mode, and measurement is executed again.

In such a radiation detector 600, compared to a radiation detector using a photomultiplier, a high-voltage source is not necessary, and while the radiation detector 600 is small, lightweight and low-cost, precision and sensitivity of the radiation detector 600 are substantially equivalent to those of the radiation detector using the photomultiplier; therefore, high-precision measurement of a low dose is possible.

Moreover, measurement in a wide range to a high dose is possible by adopting the present technology.

It is to be noted the present technology may have the following configurations.

(1) An image pickup device including:

a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence; and a sense circuit section including a sense circuit, the sense circuit configured to perform a process of detecting a pixel signal from the pixel, in which the sense circuit includes an analog-digital (AD) conversion device connected to the output signal line, the AD conversion device is allowed to operate by at least two modes, i.e., a one-bit output mode by binary decision and a gray-scale output mode by multi-bit resolution, and at least when the one-bit output mode is selected, the AD conversion device integrates output results from each of the pixels by a plurality of exposures to determine intensity of light incident on each of the pixels by calculation, or integrates output results from a plurality of pixels that are considered as a single light reception surface to determine intensity of light incident on the light reception surface by calculation.

(2) The image pickup device according to (1), in which, when the gray-scale output mode by multi-bit resolution is selected, output results by a smaller number of exposures than the number of exposures in the one-bit output mode are integrated to determine intensity of incident light by calculation.

(3) The image pickup device according to (1) or (2), in which the one-bit output mode is selected in image pickup at low illuminance, and the output mode by the multi-bit resolution is selected in image pickup at high illuminance.

(4) The image pickup device according to any one of (1) to (3), in which when the one-bit output mode is selected, a pixel signal output from the pixel is further subjected to signal amplification with a gain $G>1$, and then is input to the AD conversion device, when the output mode by the multi-bit resolution is selected, a signal output from the pixel is input to the AD conversion device without being amplified.

(5) The image pickup device according to any one of (1) to (4), including a decision result integrated circuit section configured to integrate decision results from each pixel or each pixel group by the sense circuit a plurality of times to generate image pickup data with a gray scale.

(6) A camera system provided with an image pickup device, an optical system, and a signal processing circuit, the optical system configured to form an image of a subject on the image pickup device, the signal processing circuit configured to process an output image signal of the image pickup device, the image pickup device including:

a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence; and a sense circuit section including a sense circuit, the sense circuit configured to perform a process of detecting a pixel signal from the pixel, in which the sense circuit includes an analog-digital (AD) conversion device connected to the output signal line, the AD conversion device is allowed to operate by at least two modes, i.e., a one-bit output mode by binary decision and a gray-scale output mode by multi-bit resolution, and at least when the one-bit output mode is selected, the AD conversion device integrates output results from each of the pixels by a plurality of exposures to determine intensity of light incident on each of the pixels by calculation, or integrates output results from a plurality of pixels that are considered as a single light reception surface to determine intensity of light incident on the light reception surface by calculation.

(7) The camera system according to (6), in which, when the gray-scale output mode by multi-bit resolution is selected, output results by a smaller number of exposures than the number of exposures in the one-bit output mode are integrated to determine intensity of incident light by calculation.

(8) The camera system according to (6) or (7), in which the one-bit output mode is selected in image pickup at low illuminance, and the output mode by the multi-bit resolution is selected in image pickup at high illuminance.

(9) The camera system according to any one of (6) to (8), in which when the one-bit output mode is selected, a pixel signal output from the pixel is further subjected to signal amplification with a gain G>1, and then is input to the AD conversion device, when the output mode by the multi-bit resolution is selected, a signal output from the pixel is input to the AD conversion device without being amplified.

(10) The camera system according to any one of (6) to (9), including a decision result integrated circuit section configured to integrate decision results from each pixel or each pixel group by the sense circuit a plurality of times to generate image pickup data with a gray scale.

The present disclosure contains subject matter related to that disclosed in Japanese Priority Patent Application No. 2011-228895 filed in the Japan Patent Office on Oct. 18, 2011, the entire content of which is hereby incorporated by reference.

The invention claimed is:

1. An image pickup device comprising:

a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence; and a sense circuit section including a sense circuit, the sense circuit configured to perform a process of detecting a pixel signal from the pixel, wherein the sense circuit includes an analog-digital (AD) conversion device connected to the output signal line, the AD conversion device is allowed to operate by at least two modes, i.e., a one-bit output mode by binary decision and a gray-scale output mode by multi-bit resolution, and at least when the one-bit output mode is selected, the AD conversion device integrates output results from each of the pixels by a plurality of exposures to determine intensity of light incident on each of the pixels by calculation, or integrates output results from a plurality of pixels that are considered as a single light reception surface to determine intensity of light incident on the light reception surface by calculation.

2. The image pickup device according to claim 1, wherein, when the gray-scale output mode by multi-bit resolution is selected, output results by a smaller number of exposures than the number of exposures in the one-bit output mode are integrated to determine intensity of incident light by calculation.

3. The image pickup device according to claim 1, wherein the one-bit output mode is selected in image pickup at low illuminance, and the output mode by the multi-bit resolution is selected in image pickup at high illuminance.

4. The image pickup device according to claim 1, wherein when the one-bit output mode is selected, a pixel signal output from the pixel is further subjected to signal amplification with a gain G>1, and then is input to the AD conversion device, when the output mode by the multi-bit resolution is selected, a signal output from the pixel is input to the AD conversion device without being amplified.

5. The image pickup device according to claim 1, comprising a decision result integrated circuit section configured to integrate decision results from each pixel or each pixel group by the sense circuit a plurality of times to generate image pickup data with a gray scale.

6. A camera system provided with an image pickup device, an optical system, and a signal processing circuit, the optical system configured to form an image of a subject on the image pickup device, the signal processing circuit configured to process an output image signal of the image pickup device, the image pickup device comprising:

a pixel array section including a plurality of pixels arranged in an array, each of the pixels including a photoelectric conversion device, a storage section configured to accumulate a charge generated by photoelectric conversion, and an amplifier device configured to output the accumulated charge as an electrical signal, each of the pixels configured to output an electrical signal to an output signal line in response to photon incidence; and a sense circuit section including a sense circuit, the sense circuit configured to perform a process of detecting a pixel signal from the pixel, wherein the sense circuit includes an analog-digital (AD) conversion device connected to the output signal line, the AD conversion device is allowed to operate by at least two modes, i.e., a one-bit output mode by binary decision and a gray-scale output mode by multi-bit resolution, and at least when the one-bit output mode is selected, the AD conversion device integrates output results from each of the pixels by a plurality of exposures to determine intensity of light incident on each of the pixels by calculation, or integrates output results from a plurality of pixels that are considered as a single light reception surface to determine intensity of light incident on the light reception surface by calculation.

7. The camera system according to claim 6, wherein, when the gray-scale output mode by multi-bit resolution is selected, output results by a smaller number of exposures than the number of exposures in the one-bit output mode are integrated to determine intensity of incident light by calculation.

8. The camera system according to claim 6, wherein the one-bit output mode is selected in image pickup at low illuminance, and the output mode by the multi-bit resolution is selected in image pickup at high illuminance.

9. The camera system according to claim 6, wherein
when the one-bit output mode is selected, a pixel signal output from the pixel is further subjected to signal amplification with a gain $G>1$, and then is input to the AD conversion device,
when the output mode by the multi-bit resolution is selected, a signal output from the pixel is input to the AD conversion device without being amplified.

10. The camera system according to claim 6, comprising a decision result integrated circuit section configured to integrate decision results from each pixel or each pixel group by the sense circuit a plurality of times to generate image pickup data with a gray scale.

* * * * *